United States Patent
Koo (12) United States Patent (10) Patent No.: US 8,520,445 B2
Koo (45) Date of Patent: Aug. 27, 2013

(54) SEMICONDUCTOR MEMORY DEVICE AND METHOD OF OPERATING THE SAME

(75) Inventor: Min Gyu Koo, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 120 days.

(21) Appl. No.: 13/221,944

(22) Filed: Aug. 31, 2011

(65) Prior Publication Data

US 2012/0051145 A1    Mar. 1, 2012

(30) Foreign Application Priority Data

Sep. 1, 2010 (KR) .................. 10-2010-0085444

(51) Int. Cl.
*G11C 16/06* (2006.01)

(52) U.S. Cl.
USPC ............ 365/185.25; 365/185.13; 365/185.29; 365/185.22

(58) Field of Classification Search
CPC .......... G11C 16/10; G11C 16/08; G11C 8/08; G11C 16/0483; G11C 16/12; G11C 16/14

USPC ............ 365/185.11, 185.23, 185.25, 185.17, 365/226, 185.22, 185.13

See application file for complete search history.

(56) References Cited

U.S. PATENT DOCUMENTS

2011/0096602 A1* 4/2011 Kim et al. ................ 365/185.11

FOREIGN PATENT DOCUMENTS

| KR | 1020030089315 A | 11/2003 |
|----|-----------------|---------|
| KR | 1020090124103 A | 12/2009 |

* cited by examiner

*Primary Examiner* — Thong Q Le
(74) *Attorney, Agent, or Firm* — William Park & Associates Patent Ltd (57) ABSTRACT

A memory device includes a block switch for transferring operating voltages, supplied to global lines, to local lines coupled to a memory cell array in response to the voltage level of a block selection signal and a negative voltage transfer circuit for transferring a negative voltage as the block selection signal in order to couple the global lines and the local lines when the operating voltage has a negative level and to disconnect the global lines and the local lines from each other when the block selection signal is disabled.

24 Claims, 4 Drawing Sheets

SEMICONDUCTOR MEMORY DEVICE AND METHOD OF OPERATING THE SAME

CROSS-REFERENCE TO RELATED APPLICATION

Priority is claimed to Korean patent application number 10-2010-0085444 filed on Sep. 1, 2010, the entire disclosure of which is incorporated herein by reference in its entirety.

BACKGROUND

Exemplary embodiments relate to a semiconductor memory device and more particularly to securing sufficient margin between threshold voltage distributions in a semiconductor memory device.

Data storage capacity of a memory device can be increased by configuring each memory cell to store more than one bit. There then could be four or more distributions of memory cell threshold voltages. There may be three or more distributions of threshold voltages of the memory cells in a program state as well as the distribution of threshold voltages of memory cells in an erase state. These distributions must be secured with a sufficient margin between them in order to determine without error as to which distribution of what state belongs the certain threshold voltages of the memory cells.

As a method of securing a sufficient margin between these distributions, there is a method of enlarging the range in which the threshold voltages of memory cells are limited therein. The global lines in a memory device are provided with many operating voltages. The operating voltages are then transferred from the global lines to the memory cells via pass transistors in a block switch. A block switch couples the global lines and the local lines connected to the memory cells for signal transfers between them. If the range in which the threshold voltage of the memory cell is limited were to be enlarged, then the operating voltages of the memory cells must be raised. Then, the breakdown voltages of the pass transistors in the block switch for transferring the operating voltages to the memory cells must be raised.

Further, the operating voltages provided to the pass transistors are lowered by the threshold voltages of the pass transistors by the time the operating voltages are actually provided to the memory cells. For this reason, the voltage actually provided to the pass transistor for memory cell operating voltage must be higher than the voltage level of the operating voltage required by the memory cell. However, raising the breakdown voltage of a pass transistor is difficult to do and prone to many side effects, such as, the disturbance generated by using a high operating voltage. Therefore, there is a need to secure the margin between the distributions without raising the operating voltage of a memory cell.

BRIEF SUMMARY

This disclosure relates to a memory device and a method of operating the same, which are capable of narrowing a threshold voltage distribution of an erase state and securing the margin between threshold voltage distributions of a program state by supplying both a positive voltage and a negative voltage through a block switch.

Furthermore, this disclosure relates to a memory device and a method of operating the same, which are capable of lowering the breakdown voltages of the transistors of a block switch by setting the threshold voltages of the transistors to 0 V or lower in order to prevent a voltage drop phenomenon due to the block switch.

Furthermore, this disclosure relates to a memory device and a method of operating the same, which are capable of controlling the turn-on and -off of a block switch having a threshold voltage of 0 V or lower by coupling a negative voltage transfer circuit including a transistor, having a threshold voltage higher than the block switch and capable of supplying a negative voltage, to the gate terminal of the block switch.

A memory device according to an aspect of this disclosure includes a block switch for transferring operating voltages, supplied to global lines, to local lines coupled to a memory cell array in response to a voltage level of a block selection signal and a negative voltage transfer circuit for transferring a negative voltage as the block selection signal in order to couple the global lines and the local lines when the operating voltage has a negative level and disconnect the global lines and the local lines from each other when the block selection signal is disabled.

The block switch includes pass transistors having a threshold voltage of 0 V or lower.

The block switch preferably includes triple well NMOS transistors for transferring the operating voltages of a negative level or a positive level. The negative voltage transfer circuit preferably includes a triple well NMOS transistor for transferring the block selection signal of the negative voltage level.

Each of the triple well NMOS transistors includes a gate formed on a P-type substrate, source and drain junctions formed in the P-type substrate on both sides of the gate, and a channel region formed in the P-type substrate between the source and drain junctions.

The P-type substrate includes an N well and a P-well formed on the N well. The N well may be formed by implanting phosphorus (P) of 1.0E13 to 5.0E13 atoms/cm$^2$. The P-well may be formed by implanting boron (B).

The channel region preferably is formed of an impurity non-implantation region or an implantation region into which N-type impurities are implanted in order to set the threshold voltage of the triple well NMOS transistor to 0 V or lower. The gate preferably has a length of 1.0 μm to 3 μm, and the channel region preferably has a width of 2.0 μm to 5 μm.

The memory device further includes source/drain contacts coupled to the respective source and drain junctions. In the block switch, the distance between the source/drain contacts and the gate preferably is 1 μm to 2 μm and the distance between isolation layers adjacent to the source/drain contacts and the source and drain junctions preferably is 0.3 μm to 1.0 μm.

A transistor forming the negative voltage transfer circuit preferably has a threshold voltage higher than the threshold voltage of a transistor forming the block switch.

In order for the threshold voltage of the triple well NMOS transistor of the negative voltage transfer circuit to be higher than the threshold voltage of the block switch, the channel region preferably is formed of a P-type impurity implantation region having a dose of 1.0E12 to 1.0E13 atoms/cm$^2$.

The memory device further includes a precharge circuit, including a depletion NMOS transistor configured to have a gate coupled to a block word line to which the block selection signal is supplied in order to raise the voltage level of the block selection signal and a drain coupled to a precharge voltage input terminal and a PMOS transistor configured to have a source coupled to a source of the depletion NMOS transistor and a drain coupled to the block word line.

The memory device further includes a triple NMOS transistor coupled between a ground terminal and a block word line to which the block selection signal is supplied in order to disable the block selection signal.

A method of operating a memory device according to another aspect of this disclosure includes providing the nonvolatile memory device, including a block switch for transferring operating voltages, supplied to global lines, to local lines coupled to a memory cell array in response to the voltage level of a block selection signal and a negative voltage transfer circuit for transferring a negative voltage as the block selection signal and coupling the global lines to the local lines by transferring a negative voltage as the block selection signal through the negative voltage transfer circuit when the operating voltage is in a negative level.

The method further includes disconnecting the global lines and the local lines from each other by transferring the negative voltage as the block selection signal through the negative voltage transfer circuit when the block selection signal is disabled.

The block selection signal is disabled in an operation of not selecting the nonvolatile memory device or in an erase operation of the nonvolatile memory device.

The negative voltage supplied as the block selection signal is −5 V to −1 V.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
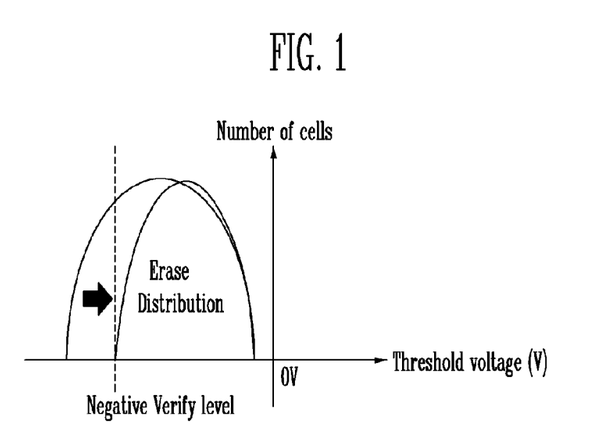
FIG. 1 is a diagram illustrating threshold voltage distributions of an erase state.

FIG. 1 illustrates one example of the threshold voltage distribution of memory cells in an erase state.

Referring to FIG. 1, a negative threshold voltage is associated with each of the memory cells in an erase state. In a program operation, the threshold voltage of a program state, which is higher than the threshold voltage of an erase state, is associated with each of the memory cells. When the erase state threshold voltage distribution of the memory cells is not made sufficiently narrow, there may be present a less-than-sufficient margin between the threshold voltage distributions of a program state. In order to secure the margin between the threshold voltage distributions of the memory cells in a program state and an erase state, the threshold voltage distribution of an erase state may be narrowed.

The erase state threshold voltages of the memory cells are 0 V or less. To narrow the erase state threshold voltage distribution, the threshold voltages in the negative region must be verified by supplying a negative verification voltage to each of the word lines connecting the relevant memory cells. Accordingly, a negative voltage needs to be provided to each memory cell of a memory device.

Figure 2:
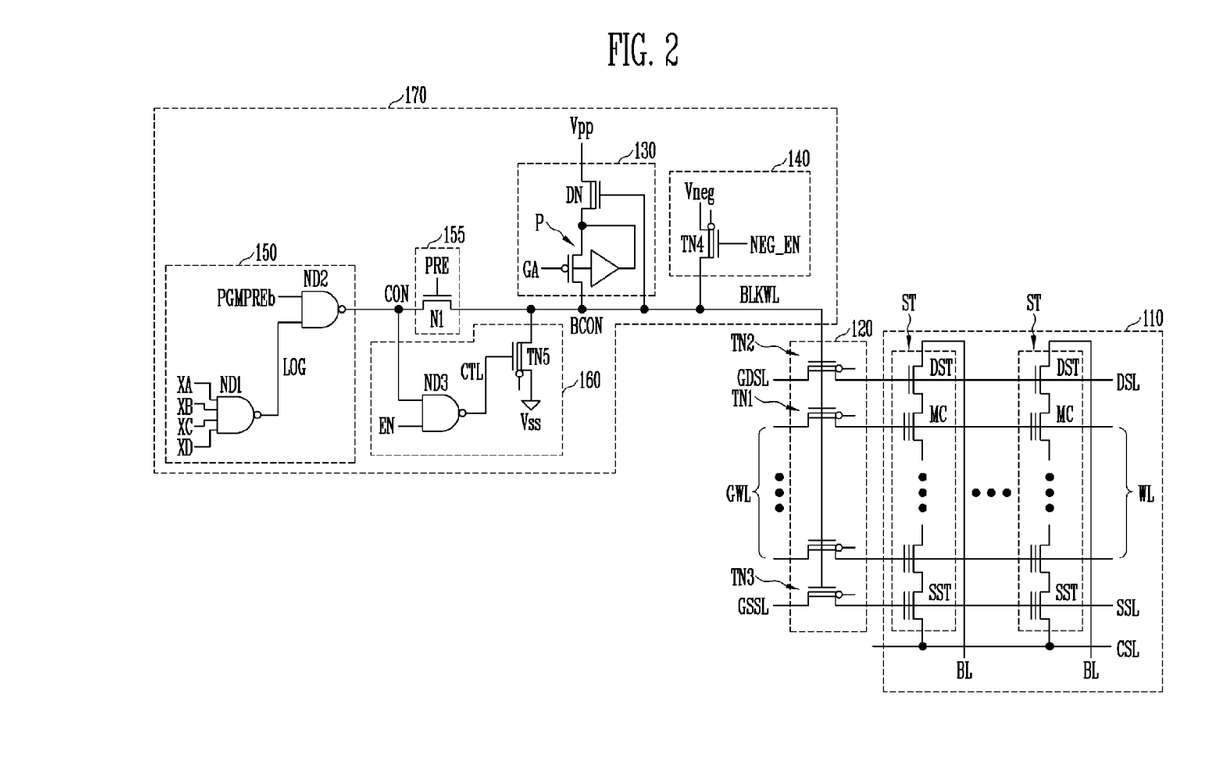
FIG. 2 is a circuit diagram of a nonvolatile memory device according to an exemplary embodiment of this disclosure.

FIG. 2 is a circuit diagram of a nonvolatile memory device according to an exemplary embodiment of this disclosure. A nonvolatile memory device capable of supplying a negative voltage to a memory cell according to an embodiment of the present invention is described below. Although the exemplary embodiments of the present invention is described with respect to a non-volatile memory device such as a flash memory, it should be readily understood that the present invention is not limited only to the non-volatile memory devices but is applicable to any type of memory devices.

As shown in FIG. 2, the nonvolatile memory device, for example, a NAND flash memory, includes a memory cell array 110 and an operation circuit group comprising a block switch 120 and a block decoder 170 for performing a program operation, a read operation, or an erase operation on the memory cells MC of the memory cell array 110.

The memory cell array 110 includes a plurality of memory blocks. The block switch 120 provides operating voltages to the memory cell array 110 and selects the memory cell array 110 by the memory block in order to perform a program operation, a read operation, or an erase operation on the memory block.

Although there is a plurality of memory blocks in the memory cell array 110, only one memory block is shown in FIG. 2. According to an embodiment of the present invention, the memory block includes a plurality of strings ST. Each string ST includes: a source selection transistor SST coupled to a common source line CSL; a plurality of the memory cells MC; and a drain selection transistor DST coupled to a bit line BL. The gate of the source selection transistor SST is coupled to a source selection line SSL. The gates of the memory cells MC are coupled to respective word lines WL. The gate of the drain selection transistor DST is coupled to a drain selection line DSL. The strings ST are coupled to the respective bit lines BL and coupled to the common source line CSL. The source selection line SSL, the drain selection line DSL, and the word lines WL coupled to the memory cell array 110 are collectively referred to as the local lines.

The block switch 120 includes first to third pass transistors TN1, TN2, TN3 for transferring a bias voltage for performing a program operation, a read operation, or an erase operation on the memory cell array 110.

The gates of the first to third pass transistors TN1, TN2, TN3 are coupled to a block word line BKLWL and are turned on or off in response to the voltage level of the block word line BKLWL. The drain and source of the first pass transistor TN1 are coupled to global word lines GWL and the word lines WL, respectively. The drain and source of the second pass transistor TN2 are coupled to a global drain selection line GDSL and the drain selection line DSL, respectively. The drain and source of the third pass transistor TN3 are coupled to a global source selection line GSSL and the source selection line SSL, respectively.

Furthermore, the first to third pass transistors TN1, TN2, TN3 are formed of high voltage NMOS transistors. The threshold voltages of these high voltage NMOS transistors may be 0 V or less in order to maintain the operating voltages (with no voltage drop) provided to the global lines GWL, GDSL, GSSL and transfer the operating voltages to the local lines WL, DSL, SSL. The high voltage NMOS transistors may be of a type such as, for example, the triple well high voltage NMOS transistors, that is capable of transferring positive and negative voltages.

The block decoder 170 includes a precharge circuit 130, a negative voltage transfer circuit 140, a signal generation circuit 150, a switching circuit 155, and a discharge circuit 160. The precharge circuit 130 precharges the block word line BKLWL to a high voltage Vpp by which a block selection signal BCON is provided to the block word line BLKWL in order to select the memory cell array 110 by the block. The negative voltage transfer circuit 140 controls the turn-on and turn-off of the block switch 120 by providing a negative voltage Vneg to the block word line BKLWL. The signal generation circuit 150 generates a selection signal CON. The switching circuit 155 provides the block word line BKLWL with the selection signal CON. The discharge circuit 160 discharges the block word line BKLWL.

The precharge circuit 130 includes a high voltage depletion NMOS transistor DN and a high voltage PMOS transistor P for precharging the block word line BKLWL to the high voltage Vpp in response to an address coding signal GA. The gate of the high voltage depletion NMOS transistor DN is coupled to the block word line BKLWL, and the drain thereof is coupled to an input terminal for receiving the high voltage Vpp. The source of the high voltage depletion NMOS transistor DN is coupled to the source of the high voltage PMOS transistor P. The drain of the high voltage PMOS transistor P is coupled to the block word line BKLWL.

When the address coding signal GA that functions to select a memory block to be controlled is enabled, the enabled signal provided to the gate of the high voltage PMOS transistor P would turn on the PMOS transistor P. The high voltage depletion NMOS transistor DN is turned on or off in response to the voltage level of the block selection signal supplied to the block word line BKLWL. The high voltage PMOS transistor P is turned on or off in response to the address coding signal GA. When both the high voltage PMOS transistor P and the high voltage depletion NMOS transistor DN are turned on, the voltage level of the block selection signal supplied to the block word line BKLWL would become to equal the high voltage Vpp.

For example, when 0V from the block word line BKLWL is provided to the gate of the high voltage depletion NMOS transistor DN having a threshold voltage of "−Vthd,", the source voltage of the high voltage depletion NMOS transistor DN becomes "Vthd" when both the high voltage PMOS transistor P and the high voltage depletion NMOS transistor DN are turned. The source voltage of the high voltage depletion NMOS transistor DN is then outputted to the block word line BKLWL via the high voltage PMOS transistor P. Accordingly, the voltage level of the block selection signal BCON provided to the block word line BKLWL rises to the source voltage "Vthd." The raised voltage level of the block selection signal BCON is fed back to the gate of the high voltage depletion NMOS transistor DN. This would result in gradually rising source voltage of the high voltage depletion NMOS transistor DN and thus the gradually rising voltage of the block selection signal BCON. Consequently, the source voltage of the high voltage depletion NMOS transistor DN and the voltage level of the block selection signal BCON become equal to the high voltage Vpp. In an embodiment of the present invention, the threshold voltage of a high voltage PMOS transistor P may be in the range of −3 V to −1 V.

The negative voltage transfer circuit 140 includes a high voltage NMOS transistor TN4. The high voltage NMOS transistor TN4 is turned on or off in response to a negative voltage control signal NEG_EN and configured to provide a negative voltage Vneg to the block word line BKLWL as the block selection signal BCON. The gate of the high voltage NMOS transistor TN4 is coupled to an input terminal for the negative voltage control signal NEG_EN, and the source and the drain thereof are coupled to an input terminal for the negative voltage Vneg and the block word line BKLWL.

Further, the high voltage NMOS transistor TN4 may be a transistor type, such as a triple well high voltage NMOS transistor, that is capable of transferring the negative voltage Vneg. The threshold voltage of the high voltage NMOS transistor TN4 may be a voltage (for example, higher than 0 V) that is higher than the threshold voltages of the pass transistors TN1, TN2, TN3. When a negative voltage (that is, an operating voltage) is provided to the global lines GDSL, GWL, GSSL, the negative voltage transfer circuit 140 transfers the negative voltage Vneg to the block word line BKLWL as the block selection signal BCON, thereby turning on the pass transistors TN1, TN2, TN3.

The signal generation circuit 150 includes first and second NAND gates ND1, ND2 for generating the selection signal CON in response to pre-decoding signals XA, XB, XC, XD and a program precharge control signal PGMPREb. The first NAND gate ND1 generates a logic signal LOG in response to the pre-decoding signals XA, XB, XC, XD. The second NAND gate ND2 generates the selection signal CON in response to the logic signal LOG and the program precharge control signal PGMPREb. The switching circuit 155 is coupled to the output terminal of the second NAND gate ND2.

The switching circuit 155 includes an NMOS transistor N1 for transferring the selection signal CON to the block word line BKLWL in response to a precharge control signal PRE in order to enable the block selection signal BCON. The source and drain of the NMOS transistor N1 are coupled to the block word line BKLWL and the output of the second NAND gate ND2, respectively. The NMOS transistor N1 is turned on or off in response to the precharge control signal PRE provided to the gate of the NMOS transistor N1.

The discharge circuit 160 includes a third NAND gate ND3 and an NMOS transistor TN5 for discharging the block word line BKLWL in response to the selection signal CON and an enable signal EN in order to disable the block selection signal BCON. The third NAND gate ND3 generates a discharge signal CTL in response to the selection signal CON and the enable signal EN. The discharge signal CTL is inputted to the gate of the high voltage NMOS transistor TN5, and the source and drain of the high voltage NMOS transistor TN5 are coupled to an input terminal for a ground voltage Vss and the block word line BKLWL, respectively. The high voltage NMOS transistor TN5 is operated in response to the discharge signal CTL. The NMOS transistor TN5 coupled to the third NAND gate ND3 may be a triple well NMOS transistor for an operation when the block selection signal of the block word line BKLWL has a negative level.

A method of operating the nonvolatile memory device according to an embodiment of this disclosure is described below.

In an operation of selecting a memory block, the pre-decoding signals XA, XB, XC, XD all having a high level are inputted to the first NAND gate ND1. When all pre-decoding signals XA, XB, XC, XD are at a high level, the first NAND gate ND1 generates the logic signal LOG of a low level. The logic signal LOG of a low level and the program precharge control signal PGMPREb of a low level are inputted to the second NAND gate ND2, and the second NAND gate ND2 generates the selection signal CON of a high level. Furthermore, the NMOS transistor N1 is turned on in response to the precharge control signal PRE of a high level, and so the switching circuit 155 transfers the selection signal CON to the block word line BKLWL, thereby enabling the block selection signal BCON.

The selection signal CON of a high level is also inputted to the discharge circuit 160. The selection signal CON of a high level and the enable signal EN of a high level are inputted to the third NAND gate ND3, and so the third NAND gate ND3 generates the discharge signal CTL of a low level. The NMOS transistor TN5 remains turned off in response to the discharge signal CTL of a low level. Accordingly, the block word line BKLWL is not coupled to the input terminal for the ground voltage Vss.

The high voltage depletion transistor DN of the precharge circuit 130 is turned on in response to the voltage level of the block selection signal BCON enabled in the block word line BKLWL. The high voltage PMOS transistor P is turned on in response to the enabled address coding signal GA. Accordingly, the voltage level of the block selection signal BCON becomes equal to the high voltage Vpp.

The block switch 120 couples the global lines GDSL, GWL, GSSL to the respective local lines DSL, WL, SSL when the block selection signal BCON provided to the block word line BKLWL equals the high voltage Vpp. Then, the voltages such as a program voltage or a read voltage would be transferred to the local lines DSL, WL, SSL of the selected memory block from the global lines GDSL, GWL, GSSL. The block switch 120 according to an embodiment of this disclosure includes the pass transistors TN1, TN2, TN3 having threshold voltages of 0 V or lower. Accordingly, there would be no voltage drop caused by the pass transistors TN1, TN2, TN3 when an operating voltage is provided to the local lines DSL, WL, SSL from the global lines GDSL, GWL, GSSL.

Furthermore, the negative voltage control signal NEG_EN in the negative voltage transfer circuit 140 is disabled, so that the block word line BKLWL and the input terminal for the negative voltage Vneg are separated from each other.

In an operation of not selecting a memory block, at least one of the pre-decoding signals XA, XB, XC, XD is disabled, for example, to a low level. When one or more low level pre-decoding signals XA, XB, XC, XD are inputted to the first NAND gate ND1, the logic signal LOG of a high level would be outputted. When the high level logic signal LOG and the low level program precharge control signal PGM-PREb are inputted to the second NAND gate ND2, the second NAND gate ND2 generates the selection signal CON of a low level.

The selection signal CON of a low level is inputted to the third NAND gate ND3 of the discharge circuit 160. The third NAND gate ND3 would then generate the discharge signal CTL of a high level, and the NMOS transistor TN5 is turned on in response to the high level discharge signal CTL. This would couple the block word line BKLWL to the ground voltage Vss, by which the voltage level of the block word line BKLWL is discharged to disable the block selection signal BCON. Furthermore, the address coding signal GA would be disabled so that the high voltage PMOS transistor P would remain turned off. Accordingly, the voltage level of the block word line BKLWL would not rise to the high voltage Vpp.

The threshold voltages of the pass transistors TN1, TN2, TN3 are 0 V or lower. Although the block selection signal of the block word line BKLWL is disabled in a ground voltage level, it may be possible that the pass transistors TN1, TN2, TN3 could turn on. In order ensure that the pass transistors TN1, TN2, TN3 remain turned off, the block selection signal of the block word line BKLWL is disabled and the negative voltage control signal NEG_EN is then enabled. Consequently, the high voltage NMOS transistor TN4 is turned on in response to the negative voltage control signal NEG_EN, and the block word line BKLWL is coupled to the negative voltage Vneg. Accordingly, the negative voltage Vneg is provided to the block word line BKLWL as the block selection signal. Accordingly, the pass transistors TN1, TN2, TN3 of the block switch 120 would remain turned off in response to the negative voltage Vneg, so that the global lines GDSL, GWL, GSSL and the local lines DSL, WL, SSL are disconnected from each other.

The high voltage NMOS transistor TN4 transfers a voltage that is lower than the negative voltage Vneg (for example, lowered by 1 V) to the block word line BKLWL. In order to provide sufficient voltage level to the block word line BKLWL so as to turn off the pass transistors TN1, TN2, TN3, the negative voltage Vneg provided to the high voltage NMOS transistor TN4 is set according to Equation 1.

$$Vneg = (Vt - \text{Pass Tr off margin Bias } 1V - TN4 \text{ off margin Bias } 1V)*(-1) \quad \text{[Equation 1]}$$

In Equation 1, Vt is the threshold voltage of TN4, and 'Pass Tr off margin Bias' is an off margin bias of one of TN1, TN2, and TN3

In an erase operation, the negative voltage control signal NEG_EN is enabled to turn on the high voltage NMOS transistor TN4 so that the block selection signal BCON provided to the block word line BKLWL becomes a negative voltage level. This turns off the pass transistors TN1, TN2, TN3 of the block switch 120 in response to the negative voltage level so that the global lines GDSL, GWL, GSSL and the local lines DSL, WL, SSL are disconnected from each other. Accordingly, the memory cells MC would be in a floating state.

Furthermore, to perform an erase operation, a high voltage (for example, 20 V) is provided to the substrate (not shown) of the memory cell array 110. This creates a voltage difference between the memory cells MC and the substrate, and the memory block would be erased as the electrons of the memory cells MC are discharged toward the substrate. To prevent an erase disturb phenomenon, which may occur when the high voltage supplied to the substrate is leaked via the pass transistors TN1, TN2, TN3 during an erase operation, the voltages of −1 V or less may be provided to the gates of the pass transistors TN1, TN2, TN3 so that the pass transistors TN1, TN2, TN3 are turned off.

In an erase verification operation using a negative verification voltage, the negative voltage control signal NEG_EN is enabled to turn on the high voltage NMOS transistor TN4. Thus, the voltage level of the block selection signal BCON supplied to the block word line BKLWL becomes a negative level. Furthermore, a negative voltage for erase verification is supplied to the global lines GDSL, GWL, GSSL coupled to the pass transistors TN1, TN2, TN3. Accordingly, the pass transistors TN1, TN2, TN3 are turned on in response to the negative voltage level of the block selection signal BCON, thus transferring the negative voltage to the local lines DSL, WL, SSL. It is preferred that voltage of −5 V to −1 V be provided to the gates of the pass transistors TN1, TN2, TN3 (that is, the block word line BKLWL).

As described above, in the nonvolatile memory device according to an embodiment of this disclosure, a negative operating voltage can be supplied to the memory cell array 110 through the block switch 120 including the pass transistors TN1, TN2, TN3 capable of supplying a negative voltage. Accordingly, the threshold voltages of memory cells having an erase state can be verified using a negative verification voltage. Consequently, the margin between threshold voltage distributions of a program state can be secured by narrowing the threshold voltage distribution of an erase state.

Furthermore, according to an embodiment of this disclosure, the threshold voltages of the pass transistors TN1, TN2, TN3 of the block switch 120 are set to 0 V or lower in order to prevent a voltage drop phenomenon due to the block switch. Accordingly, the breakdown voltages of the pass transistors TN1, TN2, TN3 can be lowered because a high voltage with consideration taken of the voltage drop needs not to be supplied to the pass transistors TN1, TN2, TN3.

Furthermore, according to an embodiment of this disclosure, the negative voltage transfer circuit 140 having a threshold voltage (for example, 0 V or lower) that is higher than the threshold voltages of the pass transistors TN1, TN2, TN3 and capable of supplying a negative voltage is coupled to the gates of the pass transistors TN1, TN2, TN3. Accordingly, the turn-on's and turn-off's of the pass transistors TN1, TN2, TN3 can be controlled.

Figure 3A:
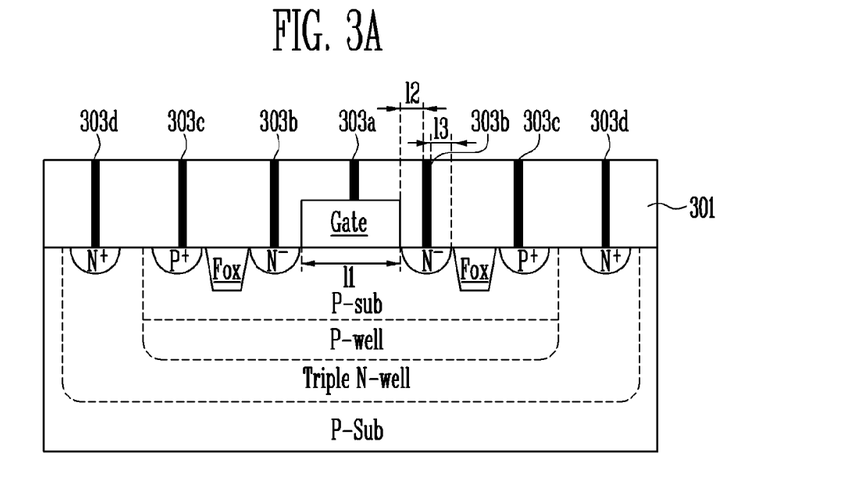
FIGS. 3A and 3B are diagrams illustrating the pass transistors of the nonvolatile memory device shown in FIG. 2.
Figure 3B:
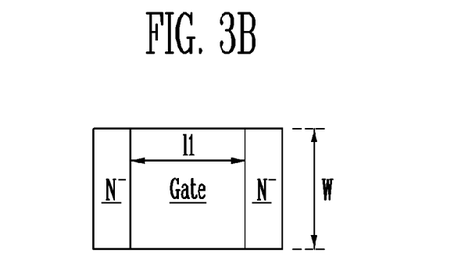

FIGS. 3A-3B illustrate a pass transistor such as TN1, TN2, TN3 of the nonvolatile memory device shown in FIG. 2. More particularly, FIGS. 3A-3B are diagrams illustrating the structure of a pass transistor having a threshold voltage of 0 V or lower and capable of transferring a negative voltage according to an embodiment of the present invention.

Referring to FIGS. 3A-3B, the pass transistor according to an exemplary embodiment of this disclosure includes a gate Gate and source and drain junctions N-. The gate Gate is formed on a specific region of a P-type substrate P-Sub, and the source and drain junctions N- are formed in the P-type substrate P-Sub on both sides of the gate Gate. The source and drain junctions N- are formed by implanting N-type impurity ions. The P-type substrate P-Sub is divided into an isolation region and an active region. Isolation layers Fox are formed in the isolation region. The active region between the source and drain junctions N- is used as the channel region of the pass transistor.

In order for the pass transistor to have a threshold voltage of 0 V or lower, P-type impurities (which are commonly implanted into the channel region of the pass transistor so as to control the threshold voltage of a high voltage NMOS transistor) are not implanted into the channel region of the pass transistor. In detail, in the pass transistor according to an embodiment of this disclosure, an impurity non-implantation region may be used as the channel region. Or an impurity implantation region of an N type, such as arsenic (As), may be used as the channel region so that the pass transistor has a threshold voltage of 0 V or lower according to an embodiment of this disclosure.

The pass transistor according to an embodiment of this disclosure may further include a triple N-well formed within the P-type substrate P-Sub and a P-well formed on the triple N-well. The triple N-well is formed to use a negative voltage. The P-well is formed to prevent a punch-through phenomenon between the triple N-well and the source and drain junctions N-. The triple N-well may be formed by implanting N-type impurities, such as phosphorus (P), with energy of 1 MeV to 3 MeV. Further, the implanted N-type impurities may be limited to a dose of 1.0E13 to 5.0E13 atoms/cm$^2$. The P-well may be formed by implanting P-type impurities, such as boron (B), with energy of 100 KeV to 600 KeV.

Furthermore, the length l1 (that is, the gate length between the source and drain junctions N-) of the gate of the pass transistor may be 1.0 μm to 3 μm or less according to an embodiment of this disclosure. The width W (that is, the width of the active region overlapping with the gate) of the channel region of the pass transistor may be 2 μm to 5 μm according to an embodiment of this disclosure.

An insulating layer 301 is formed on the P-type substrate P-Sub in which the gate is formed. A plurality of contact structures 303a, 303b, 303c, 303d is formed to penetrate the insulating layer 301. The contact structures include the gate contact 303a coupled to the gate, the source/drain contacts 303b coupled to the respective source and drain junctions N-, first well pickup contacts 303c coupled to the P-type substrate P-Sub on the P-well, and second well pickup contacts 303b coupled to the triple N-well. The distance l2 between the source/drain contact 303b and the gate may be 1 μm to 2 μm. The distance l3 (that is, the distance between the source/drain contacts 303b and the isolation layer Fox) between the source/drain contacts 303b and the boundary of the active region may be 0.3 μm to 1.0 μm.

Figure 4A:
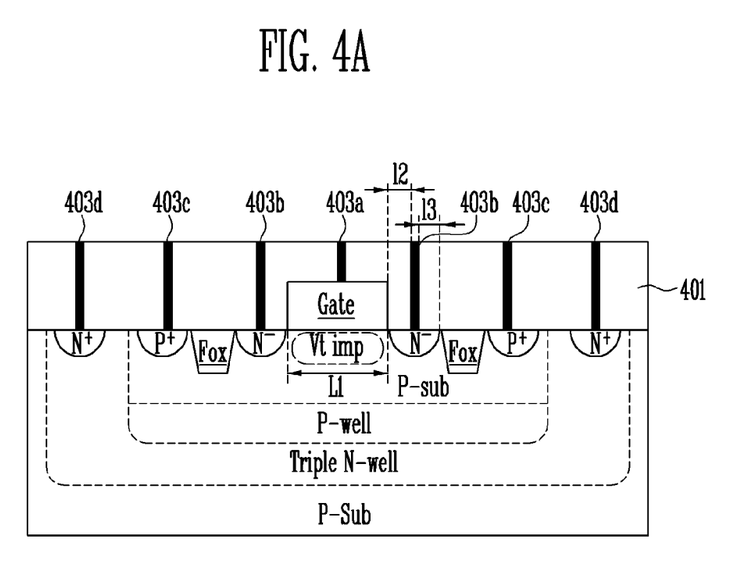
FIGS. 4A and 4B are diagrams illustrating the transistor of the negative voltage transfer circuit of the nonvolatile memory device shown in FIG. 2.
Figure 4B:
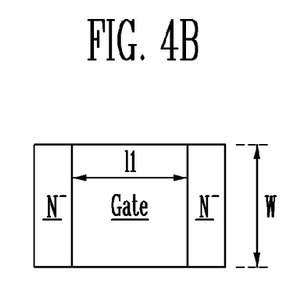

FIGS. 4A-4B are diagrams illustrating the transistor of the negative voltage transfer circuit such as TN4 of the nonvolatile memory device shown in FIG. 2. More particularly, FIGS. 4A-4B are diagrams illustrating the structure of the transistor of the negative voltage transfer circuit which has a threshold voltage higher than that of the pass transistor and can transfer a negative voltage, and control the turn-on and -off of the pass transistor.

Referring to FIGS. 4A-4B, the transistor of the negative voltage transfer circuit according to an exemplary embodiment of this disclosure includes a gate Gate and source and drain junctions N-. The Gate is formed over a specific region of a P-type substrate P-Sub, and the source and drain junctions N- are formed in the P-type substrate P-Sub on both sides of the gate. The source and drain junctions N- are formed by implanting N-type impurity ions. The P-type substrate P-Sub is divided into an isolation region and an active region. Isolation layers Fox are formed in the isolation region. The active region between the source and drain junctions N- is used as the channel region of the transistor. A threshold voltage impurity implantation region Vt imp is formed in the channel region of the transistor of the negative voltage transfer circuit by implanting P-type impurities, such as boron (B), so that the transistor of the negative voltage transfer circuit has a threshold voltage higher than that of the pass transistor. In detail, the threshold voltage impurity implantation region Vt imp may be formed by implanting the P-type impurities with energy of 30 KeV to 100 KeV. The P-type implanted impurities may be limited to a dose of 1.0E12 to 1.0E13 atoms/cm$^2$.

The transistor of the negative voltage transfer circuit according to an exemplary embodiment of this disclosure may further include a triple N-well and a P-well. The triple N-well is formed within the P-type substrate P-Sub, and a P-well is formed on the triple N-well. The triple N-well is formed to use a negative voltage. The P-well is formed to prevent a punch-through phenomenon between the triple N-well and the source and drain junctions N-. The triple N-well is formed by implanting N-type impurities, such as phosphorus (P). The P-well is formed by implanting P-type impurities, such as boron (B).

An insulating layer 401 is formed on the P-type substrate P-Sub in which the gate is formed. A plurality of contact structures 403a, 403b, 403c, 403d is formed to penetrate the insulating layer 401. The contact structures include the gate contact 403a coupled to the gate, the source/drain contacts 403b coupled to the respective source and drain junctions N-, first well pickup contacts 403c coupled to the P-type substrate P-Sub on the P-well, and second well pickup contacts 403b coupled to the triple N-well.

Although not shown in the drawings, the channel region of a common high voltage NMOS transistor (other than the channel regions of the high voltage NMOS transistor having a threshold voltage of 0 V or lower and the high voltage NMOS transistor for controlling the turn-on's and turn-off's of the high voltage NMOS transistor having the threshold voltage of 0 V or lower as in an embodiment of this disclosure) is formed by implanting P-type impurities, such as boron (B), with energy of 10 KeV to 30 KeV. The P-type impurities are implanted with a dose of 1.0E12 to 1.0E13 atoms/cm$^2$. Furthermore, the distance between the gate and the source/drain contacts of the high voltage NMOS transistor of the discharge circuit may be 1 μm to 2 μm.

The nonvolatile memory device according to an exemplary embodiment of this disclosure may, for example, use a program voltage of 27 V or lower and an erase voltage of 25 V or lower for the purpose of the cell operation of the memory cell array.

As described above, according to an embodiment of this disclosure, a negative bias voltage can be provided to the memory cell array through the block switch capable of supplying a negative voltage. Accordingly, the threshold voltages of memory cells having an erase state can be verified using a negative verification level. Consequently, the margin between threshold voltage distributions of a program state can be secured by narrowing a threshold voltage distribution of an erase state.

Furthermore, according to an embodiment of this disclosure, the threshold voltages of the pass transistors of the block switch are set to 0 V or lower in order to prevent a voltage drop phenomenon due to the block switch. Accordingly, the breakdown voltages of the pass transistors can be lowered, because a high voltage with consideration taken of the voltage drop needs not to be provided to the pass transistors.

Furthermore, according to an embodiment of this disclosure, the negative voltage transfer circuit having a threshold voltage higher than the threshold voltages of the pass transistors and capable of supplying a negative voltage is coupled to the gates of the pass transistors. Accordingly, the turn-on and -off of the pass transistors can be controlled.

What is claimed is:

1. A memory device, comprising:
   a block switch configured to transfer a first voltage from a global line to a local line connected to a memory cell array in response to a block selection signal supplied to a block word line; and
   a negative voltage transfer circuit configured to transfer a negative voltage to the block word line so that the block selection signal becomes a negative level,
   wherein the block switch operates to connect the global line and the local line by supplying the first voltage having a negative level to the global line and by transferring the negative voltage to the block word line when an erase verification operation is performed on the memory cell array.

2. The memory device of claim 1, wherein the block switch comprises a pass transistor having a threshold voltage of 0 V or lower.

3. The memory device of claim 1, wherein the block switch comprises a triple well NMOS transistor capable of transferring the first voltage of either a negative or positive level.

4. The memory device of claim 3, wherein the triple well NMOS transistor comprises:
   a gate formed on a P-type substrate;
   source and drain junctions formed in the P-type substrate on both sides of the gate; and
   a channel region formed in the P-type substrate between the source and drain junctions.

5. The memory device of claim 4, wherein the channel region is formed of an impurity non-implantation region or an implantation region into which N-type impurities are implanted in order to set the threshold voltage of the triple well NMOS transistor to 0 V or lower.

6. The memory device of claim 5, wherein the P-type substrate comprises an N well and a P-well formed on the N well.

7. The memory device of claim 6, wherein the N well is formed by implanting phosphorus (P) of an amount in the range of $1.0E13$ atoms/cm$^2$ to $5.0E13$ atoms/cm$^2$.

8. The memory device of claim 7, wherein the P-well is formed by implanting boron (B).

9. The memory device of claim 4, wherein the gate has a length in the range of 1.0 μm to 3 μm.

10. The memory device of claim 4, wherein the channel region has a width in the range of 2.0 μm to 5 μm.

11. The memory device of claim 4, further comprising source/drain contacts coupled to the respective source and drain junctions.

12. The memory device of claim 11, wherein a distance between the source/drain contacts and the gate is in the range of 1 μm to 2 μm.

13. The memory device of claim 11, wherein a distance between isolation layers adjacent to the source/drain contacts and the source and drain junctions is in the range of 0.3 μm to 1.01 μm.

14. The memory device of claim 1, wherein the negative voltage transfer circuit comprises a triple well NMOS transistor for transferring the block selection signal of the negative voltage level.

15. The memory device of claim 14, wherein the triple well NMOS transistor comprises:
   a gate formed over a P-type substrate;
   source and drain junctions formed in the P-type substrate on both sides of the gate; and
   a channel region formed in the P-type substrate between the source and drain junctions.

16. The memory device of claim 15, wherein the channel region is formed of a P-type impurity implantation region having a dose in the range of $1.0E12$ to $1.0E13$ atoms/cm$^2$ in order to have a threshold voltage of the triple well NMOS transistor higher than a threshold voltage of the block switch.

17. The memory device of claim 15, wherein the P-type substrate comprises an N well and a P-well formed on the N well.

18. The memory device of claim 1, wherein a transistor forming the negative voltage transfer circuit has a threshold voltage higher than a threshold voltage of a transistor forming the block switch.

19. The memory device of claim 1, further comprising a precharge circuit,
   wherein the precharge circuit comprises:
   a depletion NMOS transistor configured to have a gate coupled to a block word line to which the block selection signal is supplied in order to raise the voltage level of the block selection signal and a drain coupled to a precharge voltage input terminal; and
   a PMOS transistor configured to have a source coupled to a source of the depletion NMOS transistor and a drain coupled to the block word line.

20. The memory device of claim 1, further comprising a triple NMOS transistor coupled between a ground terminal and the block word line.

21. A method of operating a memory device, comprising:
   providing the nonvolatile memory device, comprising a block switch for transferring operating voltages, supplied to global lines, to local lines coupled to a memory cell array in response to a voltage level of a block selection signal supplied to a block word line and a negative voltage transfer circuit for transferring a negative voltage to the block word line so that the block selection signal becomes a negative level; and
   coupling the global lines to the local lines by transferring a negative voltage to the block word line through the negative voltage transfer circuit and by supplying the operating voltage having a negative level to the global lines when an erase verification operation is performed.

22. The method of claim 21, further comprising disconnecting the global lines and the local lines from each other by transferring the negative voltage to the block word line through the negative voltage transfer circuit when the block selection signal is disabled.

23. The method of claim 21, wherein the block selection signal is disabled in an operation of not selecting the nonvolatile memory device or in an erase operation of the nonvolatile memory device.

24. The method of claim 21, wherein the negative voltage supplied as the block selection signal is −5 V to −1 V.

* * * * *